United States Patent [19]

Mattisson

[11] Patent Number: 4,460,872
[45] Date of Patent: Jul. 17, 1984

[54] LOW NOISE DIFFERENTIAL AMPLIFIER

[75] Inventor: Sven Mattisson, Bjarred, Sweden

[73] Assignee: Inventab Audio Kb, Lund, Sweden

[21] Appl. No.: 327,074

[22] Filed: Dec. 3, 1981

[51] Int. Cl.³ .............................................. H03F 3/45
[52] U.S. Cl. .................................... 330/252; 330/256; 330/149
[58] Field of Search ................. 330/252, 254, 256, 69, 330/149; 307/299 A

[56] References Cited

U.S. PATENT DOCUMENTS 4,035,737 7/1977 Curl ................................. 330/263 X
4,210,875 7/1980 Beasom ............................... 330/261

FOREIGN PATENT DOCUMENTS 642843 1/1979 U.S.S.R. .............................. 330/252

OTHER PUBLICATIONS

Millican, D. L., "Four-Level Gain Control Stage", IBM Technical Disclosure Bulletin, vol. 14, No. 9, Feb. 1972.

Primary Examiner—James B. Mullins
Assistant Examiner—Steven J. Mottola
Attorney, Agent, or Firm—Yount & Tarolli

[57] ABSTRACT

A low noise amplifier circuit (FIGS. 4 and 5) is disclosed including plural differential amplifiers having their inputs and outputs connected to common input and output lines (50, 52; 54, 56). In the disclosure, each differential amplifier is comprised of a pair of bipolar junction transistors (40, 42; 58, 60; 64, 66) of the same type. Parallel connecting of the differential amplifiers in the disclosed fashion reduces the Johnson noise introduced by the base spreading resistances of the individual transistors. Since differential amplifiers, per se, are connected in parallel rather than their component transistors, thermal runaway is not a problem.

11 Claims, 5 Drawing Figures

LOW NOISE DIFFERENTIAL AMPLIFIER

BACKGROUND AND FIELD OF THE INVENTION

The present invention relates to amplifiers, and more particularly to a differential amplifier configured to provide very low noise operation.

Many types of devices generate very low amplitude signals which must be amplified to provide a usable signal. Strain gauges and phono cartridges are but two examples of such devices. Because of the low level of the signal, introduction of noise in the amplification process becomes difficult to avoid. One source of noise in bipolar junction transistor amplifiers is the resistance in the base-emitter junction of the transistor. This resistance, known as the base spreading resistance, introduces a noise referred to as "Johnson" noise to the amplified signal. The amount of noise introduced is directly related to the value of the base spreading resistance. In conventional, low frequency transistors a practical lower limit on the base spreading resistance is approximately 40 ohms. If this base spreading resistance could be reduced below this limit, improved noise performance would result.

One known way of reducing the base spreading resistance is to connect several transistors in parallel, with their bases, collectors, and emitters commonly connected. The base spreading resistances of the several parallel-connected transistors then appear in parallel with one another, hence the combined result is to reduce the resistance to the parallel combination of the base spreading resistances of the various transistors. To prevent thermal runaway of this plural transistor arrangement it has been found necessary to include resistors in the emitter circuits in each of the transistors. These resistors, of course, add to the effect of the input resistance and increase the equivalent noise resistance.

Noise introduction by the base spreading resistance of junction transistors is even more of a problem in differential amplifiers, which are commonly used to amplify low level input signals in view of their high gain, high common mode rejection, and low drift. This is because in differential amplifiers the base-emitter junctions of two transistors are effectively coupled to series across the input lines, whereby the equivalent noise resistance is effectively doubled. In order to produce the same level of noise which would be found in a comparable single transistor amplifier, a differential amplifier must include a transistor connected in parallel with each of the two differential transistors, thereby requiring that four transistors be used in the amplifier. In fact, since emitter resistors must again be used to prevent thermal runaway, the noise performance of the four transistor differential amplifier will not be as good as that of a conventional single transistor amplifier. It would clearly be desirable if some method could be devised for avoiding the use of the emitter resistances so as to thereby improve the noise performance of the differential amplifier.

SUMMARY OF THE INVENTION

In accordance with the present invention, the noise performance of differential amplifiers is improved by connecting the differential amplifiers per se, rather than the transistors thereof, in parallel. When coupled together in this fashion, the problem of thermal runaway does not occur, hence the emitter resistors used in conventional techniques need not be employed. Thus, the amplifier provides better noise performance than in conventional differential amplifiers.

BRIEF DESCRIPTION OF THE DRAWINGS

The foregoing and other objects and advantages of the present invention will become more readily apparent from the following detailed description, as taken in conjunction with the accompanying drawings, wherein.

DETAILED DESCRIPTION

Figure 1:
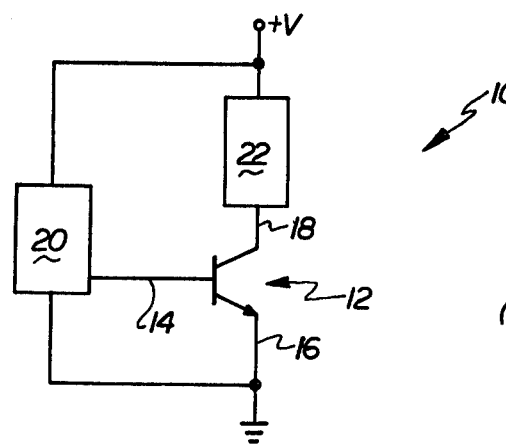
FIG. 1 is a general schematic of a conventional single transistor amplifier.

There is illustrated in FIG. 1 a circuit schematic of one form of a conventional common emitter amplifier 10 including a single bipolar junction transistor 12. The transistor 12 is a three-terminal device having a control electrode (base 14), and first and second electrodes (collector 18 and emitter 16) defining a primary current path through which a controlled current flows. Connected to the base 14 is an input circuit 20 which represents the signal source and the circuit elements which bias the transistor 12 for proper operation. The amplifier 10 also includes a load circuit 22 connected between the collector of the transistor 12 and a +V supply. A power supply (not shown) provides a power supply voltage between the +V supply terminal and ground. In the example shown in FIG. 1 no emitter circuit is included, the emitter instead being directly connected to ground.

The transistor 12 inherently presents a small amount of resistance, known as base spreading resistance, which essentially appears as a small resistance connected in series with the base. This base spreading resistance introduces noise, known as Johnson noise, in the amplified signal. It is desirable that this noise component be reduced, particularly in those applications in which the input signal has a very low level, where the Johnson noise may appear quite large in comparison.

Figure 2:
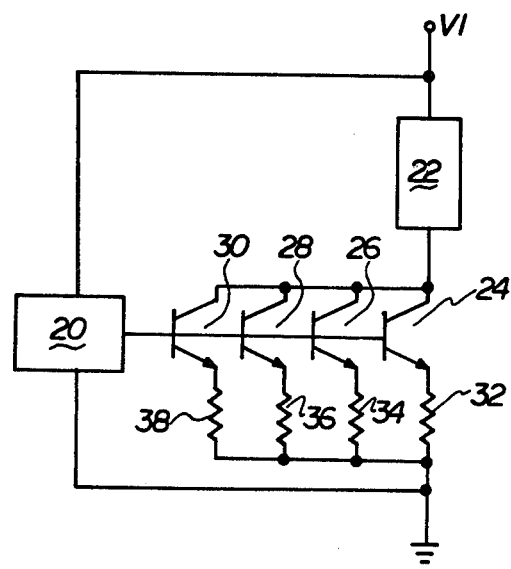
FIG. 2 is a diagram of a circuit modified in accordance with the teachings of the prior art so as to produce lower equivalent noise resistance.

One conventional manner of reducing the base spreading resistance so as to thereby improve the noise performance of the amplifier is shown in FIG. 2. The FIG. 2 amplifier is very similar to the FIG. 1 amplifier, except that the transistor 12 has been replaced by four transistors 24, 26, 28 and 30 connected in parallel with one another. The bases of these four transistors are commonly connected to the base circuit 20, whereas their collectors are commonly connected to the load circuit 22. Similarly, their emitters are commonly connected through small emitter resistances 32-38 to ground. Ignoring the emitter resistances for a moment, it will be noted that the base-emitter junctions of the transistors 24-30 are connected in parallel with one another. Because of this, the base spreading resistances inherent in each of the transistors effectively appear in parallel with one another. Since the resistance of four equal resistors connected in parallel with one another is one quarter of the resistance of any of them individually the effective base resistance of this circuit would be one quarter of that of FIG. 1 if the emitter resistors 32–38 were not included. This would lead to a commensurate reduction in Johnson noise, providing the amplifier with improved noise performance.

The emitter resistances, 32, 34, 36 and 38 are undesirable from the standpoint that they increase the effective noise resistance of the amplifier, introducing additional noise into the system. They have been found necessary, however, to prevent thermal runaway of the parallel transistor combination. The thermal runaway problem arises because the transistors 24, 26, 28 and 30 are not absolutely identical. It is inevitable that one of these transistors will have a smaller base emitter voltage characteristics than the others, whereby it will necessarily draw somewhat more base current than the others. Since the base current, and therefore the collector current also, are greater in one transistor than in the others, that one transistor will experience a greater temperature rise than the others. The base-emitter voltage of these transistors has a negative temperature coefficient, however, whereby the increase in temperature will be accompanied by a decrease in the base-emitter voltage. This in turn increases the conduction of that transistor, thereby increasing its heating, thereby further increasing its conduction, etc. The end result would be that a single one of the transistors conducted substantially all of the current, with the remaining transistors being cut off. The effect of this would be to disconnect three of the transistors from the circuit, whereby the noise performance would be the same as that of the FIG. 1 embodiment.

The emitter resistors 32, 34, 36 and 38 eliminate this by adding a small degree of negative feedback. Thus, as the current passing through any one of the transistors increases, the voltage appearing across its associated emitter resistor will similarly increase, thereby correspondingly increasing the emitter potential and thus reducing conduction of that transistor. Similarly, if one transistor reduces its conduction, the voltage appearing across its emitter resistor will diminish, whereby the emitter voltage will similarly diminish and conduction of the transistor will increase.

Although these emitter resistors are necessary to stabilize the operation of the FIG. 2 configuration, they also increase the equivalent noise resistance of the circuit, degrading its noise performance. It would be desirable if some manner could be provided for paralleling the transistors without using emitter resistances.

The problem of equivalent noise resistance is even greater in differential transistor amplifiers, commonly used for amplifying low level input signals, because the base-emitter junctions of the two differential transistors are effectively coupled in series across the input. This can be seen in FIG. 3, which is a circuit schematic of the conventional differential amplifier stage. In this Figure, the two differential amplifier devices 40 and 42 are again shown as being bipolar junction transistors. The emitters of these two transistors 40 and 42 are commonly joined and are connected to ground through a current source 44. Their collectors, on the other hand, are both connected to the other side of a voltage supply (shown as a positive voltage supply +V in FIG. 3) through corresponding load circuits 46 and 48. These load circuits 46 and 48 take on many different forms in conventional differential amplifiers, depending upon the particular requirements of the amplifier under consideration. The FIG. 3 differential amplifier is shown as having a double ended output, wherein the output terminals 54 and 56 are each connected to the collector of a corresponding one of the transistors 40 and 42. The input signal is applied across the bases of the two transistors 40 and 42.

It will be noted that the base-emitter junctions of the two transistors 40 and 42 are coupled in series across the input terminals 50 and 52. Because of this, the base spreading resistance of the two transistors 40 and 42 are effectively connected in series across the input terminals also.

Figure 3:
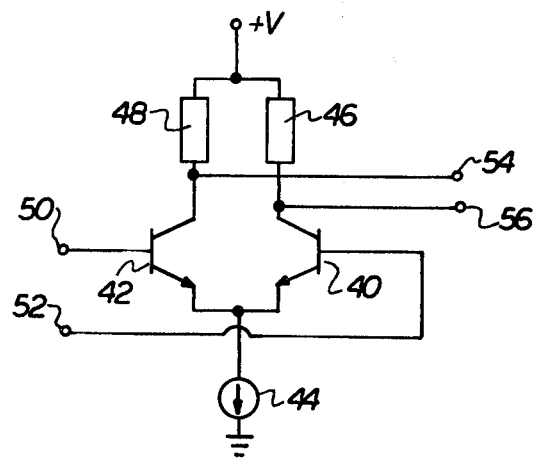
FIG. 3 is a circuit schematic of a conventional differential amplifier.

The equivalent noise resistance of FIG. 3 differential amplifier could, of course, be reduced by using the technique shown in FIG. 2. Thus, each of the transistors 40 and 42 would be replaced by a parallel combination of plural transistors. Even here, however, emitter resistances such as resistors 32–38 of FIG. 2 would be required to prevent thermal runaway at the transistors. It would be desirable to avoid the use of such resistors.

Figure 4:
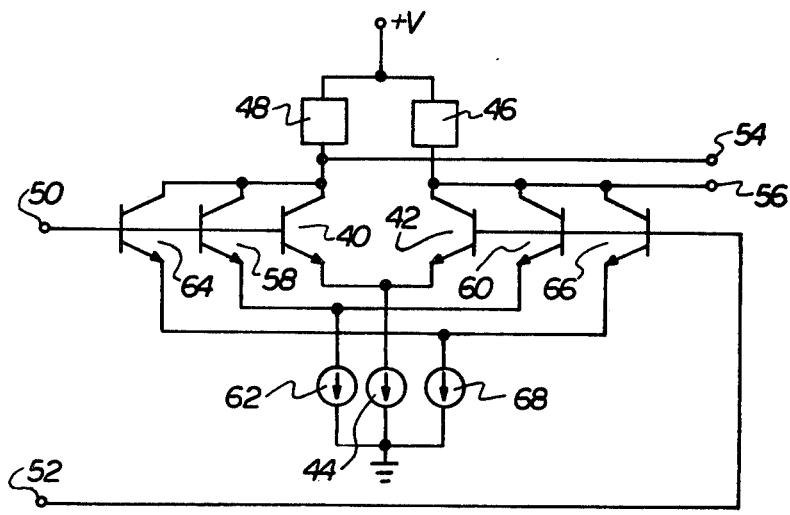
FIG. 4 is a circuit schematic of a differential amplifier in accordance with the teachings of the present invention, wherein several differential amplifiers are connected in parallel so as to produced improved noise performance.

FIG. 4 illustrates one embodiment of a low noise differential amplifier in accordance with the teachings of the present invention. The need for the emitter resistances used in the FIG. 2 embodiment is eliminated in this Figure by connecting the differential amplifiers, rather than the transistors per se, in parallel with one another.

It will be noted that the FIG. 4 embodiment includes all of the elements of the FIG. 3 embodiment in that two transistors 40 and 42 are again connected in a differential mode with a current source 44 connected from their emitters to ground. Similarly, two load circuits 46 and 48 are connected between their collectors and a +V supply. The input is again applied across two terminals 50 and 52 connected to the bases of the two transistors, whereas the output is taken across their collectors at output terminals 54 and 56.

The FIG. 4 embodiment also includes two other differential amplifiers connected in parallel with this one, however. Transistors 58 and 60 represent one of these differential amplifiers, whereas another is represented by transistors 64 and 66. Each of these differential amplifiers includes an associated emitter current source. Thus, transistors 58 and 60 have their emitters coupled together and joined to ground through a current source 62, whereas transistors 64 and 66 have their emitters coupled together and joined to ground through another current source 68. The bases of transistors 58 and 64 are coupled together to one of the input terminals 50, whereas the bases of the transistors 60 and 66 are joined to the bases 42 and thus to the other input terminal 62. Finally, the outputs of these other two differential amplifiers, representing the collectors thereof, are connected to the collectors of transistors 40 and 42, whereby they share the load circuits 46 and 48 with the first differential amplifier.

In the FIG. 4 embodiment, although the differential amplifiers are connected in parallel with one another, the individual transistors of these differential amplifiers are not. Because of this, thermal run away is not a problem with this embodiment. It is therefore not necessary to include the emitter resistor used in the prior art, as exemplified by FIG. 2. It has been nonetheless found that by connecting the differential amplifiers in parallel in this fashion, the equivalent noise resistance of the circuit is reduced in substantially the same fashion as by connecting the transistors per se in parallel, whereby improved noise performance results. The FIG. 4 embodiment therefore has the advantages of the prior method, without its attendant disadvantages.

Figure 5:
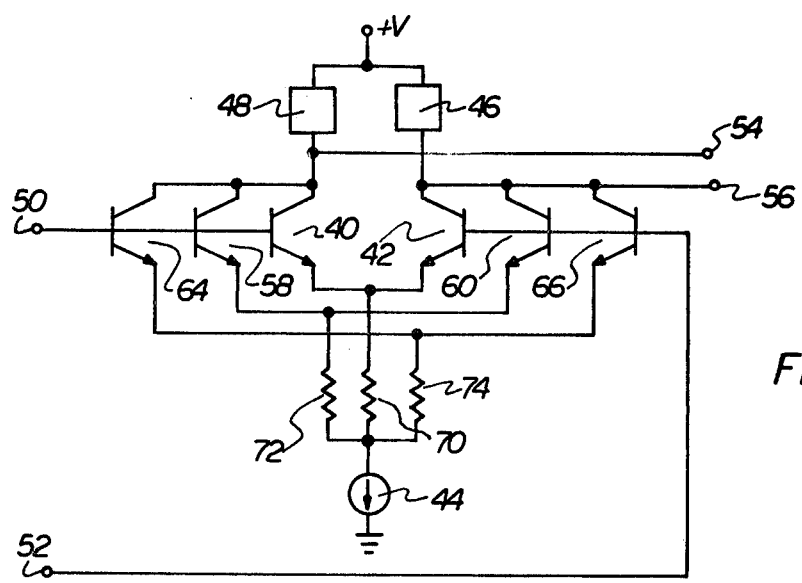
FIG. 5 is a circuit schematic of a second embodiment of the present invention.

FIG. 5 illustrates a second embodiment of the present invention, wherein the redundant current sources 62 and 68 are eliminated by connecting the emitters of all three differential amplifier pairs to a single current source 44 through corresponding resistances. The emitters of transistors 40 and 42 are connected to the current source through resistor 70, the emitters of transistors 58 and 60 are connected to the current source through resistor 72, and the emitters of transistors 64 and 66 are connected to the current source through resistor 74. These resistances do not appear across the input lines 50 and 52, and thereby do not add to the noise resistance of the circuit. They do, however, provide isolation between the various differential amplifiers, thereby producing the same effect as if independent current sources were used. Thus, the FIG. 5 embodiment produces the same advantageous result as the FIG. 4 embodiment.

In the embodiments which have heretofore been described, bipolar junction transistors have been uniformly employed as the amplifying elements. It is recognized, however, that improved noise performance will result regardless of the type of amplifying elements used. Thus, the bipolar junction transistors of FIGS. 4 and 5 could readily be replaced by vacuum tubes, field effect transistors, etc. Moreover, although the circuits have been shown as including separate and distinct load circuits 46 and 48 and a double ended output, any conventional single or double ended output and load circuits 46 and 48 could be employed.

Therefore, although the invention has been described with respect to a preferred embodiment, it will be appreciated that various rearrangements and alterations of parts may be made without departing from the spirit and scope of the present invention, as defined in the appended claims.

What is claimed is:

1. A low noise amplifier comprising:
plural differential amplifiers each having first and second inputs adapted to receive a low level analog input signal and at least one output and each comprising first and second amplifier elements connected together in a differential amplifier arrangement, each said element having a control electrode representing a corresponding one of said first and second inputs and first and second primary electrodes between which is defined a controlled current conducting path, said second electrodes of said first and second amplifier elements of each said differential amplifier being connected together, and means for providing a substantially constant current flow between said connected second electrodes of each said differential amplifier and a power supply terminals;
shorting means for shorting together said first inputs of said plural differential amplifier, and for shorting together said second inputs of said plural differential amplifiers; and
means for connecting together said outputs of said plural differential amplifiers;
wherein said low noise amplifier has a gain selected to be low enough that said amplifier elements operate in their linear operating region when amplifying said low level analog input signal.

2. A low noise amplifier as set forth in claim 1, wherein said first and second amplifier elements of said plural differential amplifiers comprise first and second bipolar junction transistors, respectively, whose bases represent said control electrodes, and whose collectors and emitters respectively represent said first and second primary electrodes.

3. A low noise amplifier as set forth in claim 1, wherein each of said plurality of impedance means is a resistor.

4. A low noise amplifier as set forth in claim 1, wherein said means for providing a substantially constant current flow comprises a plurality of current source means, each connecting a respective connected pair of said second electrodes to said power supply terminal and providing a substantially constant current flow therebetween.

5. A low noise amplifier as set forth in claim 1, wherein said means for providing a substantially constant current flow comprises a plurality of impedance means, each connecting a respective connected pair of said second electrodes to a common node, and current source means for providing a substantially constant current flow between said common node and said power supply terminal.

6. A low noise differential amplifier circuit comprising:
a plurality of differential amplifiers, each including first and second transistors of the same type having their emitters connected in common and with the bases thereof being respectively connected to first and second input terminals for said amplifier circuit, said first and second input terminals being adapted to receive a low level analog input signal;
circuit means connecting said plurality of differential amplifiers in parallel so that the base electrodes of all of said first transistors are directly connected to said first input terminal and that the bases of all of said second transistors are directly connected to said second input terminal and so that the collectors of all of said first transistors are directly connected to one another and the collectors of all of said second transistors are directly connected to one another;
loading means for connecting said collectors to a voltage source;
at least one current source; and
substantially constant impedance means for connecting each pair of said common emitters with a current source, said impedance means providing a substantially equal finite impedance between each said pair of said common emitters and said current source such that a substantially equal level of current flows between each said pair of common emitters and said current source; and
further wherein said low noise amplifier has a fixed gain, said gain selected to be low enough that said transistors operate in their linear operating region when amplifying said low level analog input signal.

7. A differential amplifier circuit as set forth in claim 6 wherein said emitter connecting means includes means for connecting the emitters of each pair of said common emitters to an individual source.

8. A differential amplifier circuit as set forth in claim 7, wherein said loading means includes a first loading circuit means for commonly connecting the collector of each of said first transistors to said voltage source and a second loading circuit means for commonly connecting the collector of each of said second transistors to said voltage source.

9. A differential amplifier circuit as set forth in claim 6, wherein said emitter connecting means includes circuit means for connecting all of said emitters to a common current source.

10. A differential amplifier circuit as set forth in claim 9, wherein said circuit means includes an emitter resistor connecting each pair of commonly connected emitters with said common current source.

11. A differential amplifier as set forth in claim 10, wherein said loading means includes a first loading circuit means for commonly connecting the collector of each of said first transistors to said voltage source and a second loading circuit means for commonly connecting the collector of each of said second transistors to said voltage source.

* * * * *